United States Patent
Richards et al.

(10) Patent No.: US 7,067,829 B2
(45) Date of Patent: Jun. 27, 2006

(54) POWER SAG DETECTION AND CONTROL IN ION IMPLANTING SYSTEM

(75) Inventors: Steven Richards, Georgetown, MA (US); Julian G. Blake, Gloucester, MA (US); Steven Campbell, Newburyport, MA (US)

(73) Assignee: Ibis Technology Coporation, Danvers, MA (US)

( * ) Notice: Subject to any disclaimer, the term of this patent is extended or adjusted under 35 U.S.C. 154(b) by 15 days.

(21) Appl. No.: 10/995,836

(22) Filed: Nov. 23, 2004

(65) Prior Publication Data

US 2006/0108544 A1    May 25, 2006

(51) Int. Cl.
*H01J 37/317*    (2006.01)

(52) U.S. Cl. .............. 250/492.21; 250/492.2; 250/492.3; 250/492.1

(58) Field of Classification Search ............ 250/492.21
See application file for complete search history.

(56) References Cited

U.S. PATENT DOCUMENTS 6,590,216 B1 *   7/2003   Doran et al. ............... 250/427
6,791,096 B1 *   9/2004   Komuro et al. ............ 250/492.2
2002/0175292 A1 * 11/2002  Whitehouse et al. ....... 250/394

* cited by examiner

*Primary Examiner*—Nikita Wells
*Assistant Examiner*—James J. Leybourne
(74) *Attorney, Agent, or Firm*—Thomas J. Engellenner; Reza Mollaaghababa; Nutter McClennen & Fish LLP

(57) ABSTRACT

In one aspect, the present invention provides a method of managing fluctuations in power supplied to a semiconductor processing apparatus that includes monitoring the power supplied to the apparatus to detect the occurrence of a power fluctuation event during a semiconductor processing session. Upon detection of a power fluctuation event, the semiconductor processing can be interrupted. After the end of the power fluctuation event, at least one operational parameter of the apparatus, e.g., vacuum level in an evacuated processing chamber, can be measured, and the semiconductor processing can be resumed when the measured operational parameter is within an acceptable range. The measured operational parameter can preferably include a parameter that recovers more slowly than others when adversely affected by a power fluctuation event.

25 Claims, 4 Drawing Sheets

POWER SAG DETECTION AND CONTROL IN ION IMPLANTING SYSTEM

BACKGROUND OF THE INVENTION

The present invention generally relates to semiconductor processing and, in particular, to methods and systems for managing fluctuations in power supplied to an apparatus employed for semiconductor processing.

A variety of semiconductor processing applications, such as ion implantation, plasma etching or plasma-enhanced chemical vapor deposition (PECVD), are known. Proper performance of such semiconductor processing applications depend, as least in part, on stability of one or more operational parameters during a processing session, e.g., the vacuum level, deposition rate, temperature or implant dosage. The stability of the operational parameters can in turn depend on stability of power/voltage applied to an apparatus employed for performing the process.

Although the occurrence of a power fluctuation event during almost any semiconductor processing session can be harmful, it can be particularly damaging to ion implantation. Ion implanters are routinely utilized to implant ions in semiconductor wafers. Such implanters typically include an evacuated housing maintained at a low pressure, an ion source that generates a plurality of ions, extraction electrodes coupled to the ion source for extracting ions therefrom to form an ion beam, and one or more magnets that allow selecting ions having an energy in a desired range and steering them to a substrate. The proper functioning of these and other elements of an ion implanter depends, at least in part, on the stability of the power/voltage supplied thereto. For example, a drop in the voltage provided to the magnet can lead to an undesired change in the trajectory of the ion beam, which can in turn result in degradation of the wafers as well as contamination of the implanter's housing. Such fluctuations of the power can occur, for example, when the line voltage drops temporarily below its normal value, a condition commonly referred to as a "power sag."

One possible way of compensating for such power fluctuations is to equip the implanter with backup power storage devices, such as, capacitors or batteries, that can be activated in the event of a power drop to maintain the supplied power at an acceptable level. However, an ion implanter typically requires a significant amount of power. Hence, such a compensation scheme would typically necessitate a large number of capacitors and/or batteries, with their concomitant costs. Further, in some extreme cases, the duration of a power fluctuation event may be so long as to exhaust the energy storage capacity of such installed backup devices. Although larger capacitive devices can help ride out longer power fluctuations, all "back-up power" systems are limited and, once their capabilities are exceeded, they provide limited (if any at all) protection for wafers undergoing ion implantation at the time of the power fluctuation.

Accordingly, there is a need for new methods and systems for managing fluctuations of power supplied to semiconductor processing equipment.

There is also a need for such methods and systems for managing fluctuations of power supplied to an ion implanter, especially during semiconductor processing.

SUMMARY OF THE INVENTION

In one aspect, the present invention provides a method of managing fluctuations in power supplied to a semiconductor processing apparatus that includes monitoring the power supplied to the apparatus to detect the occurrence of a power fluctuation event during a semiconductor processing session. Upon detection of a power fluctuation event, the semiconductor processing can be interrupted. After the end of the power fluctuation event, at least one operational parameter of the apparatus, e.g., vacuum level in an evacuated processing chamber, can be measured, and the semiconductor processing can be resumed when the measured operational parameter is within an acceptable range. The measured operational parameter can preferably include a parameter that recovers more slowly than others when adversely affected by a power fluctuation event.

In a related aspect, the semiconductor processing can include, without limitation, ion implantation, plasma etching or sputtering, and plasma enhanced chemical vapor deposition (PECVD). Those having ordinary skill in the art will appreciate that the methods and the systems of the invention are applicable to a wide array of semiconductor processing techniques and equipment, and are not limited to those expressly recited herein.

In another aspect, the present invention provides a method of managing fluctuations in power supplied to an ion implanter during implantation of a substrate by an ion beam that includes monitoring the power delivered to the implanter during operation and detecting a power fluctuation event that can adversely affect the ion beam's characteristics (e.g., trajectory or current density) during ion implantation. Upon detection of the power fluctuation event, the ion beam is interrupted. After detecting the end of the fluctuation event, at least one operational parameter of the implanter is measured, and the ion beam is restored if the measured operational parameter is within an acceptable range.

In a related aspect, the power fluctuation event can be identified by detecting a drop in a voltage applied to the implanter, e.g., the line voltage, below a selected threshold for a selected time period. For example, a voltage drop of about 10 to 20% percent below the threshold voltage for a time duration in a range of about 50 milliseconds (msec) to about 1 second can signal the occurrence of a power fluctuation event. In general, power fluctuations that do not last more than about 50 msec are not considered as bona fide power fluctuation events as such transitory changes typically do not sufficiently affect the implantation process to require accommodation. In addition, such an approach ensures that the power management schemes described herein are not triggered too frequently, thereby inhibiting system instability. It should of course be appreciated that selection of a threshold and a time duration that would signal a power fluctuation event depends on particular requirements of an ion implanter, which might, in some instances, vary from those disclosed here.

In many ion implanters, a microwave ion source or an arc source can be employed to generate an ion beam. In such implanters, the interruption of the ion beam in response to detection of a power fluctuation event can be achieved by disabling the ion source.

In further aspects, an operational parameter, which is measured to ensure that it is within an acceptable range before restoring the ion beam, can be any of a vacuum level of an evacuated chamber of the ion implanter through which an ion beam travels to a substrate, a magnetic field generated by at least one magnet for magnetic control of the ion beam generated or a voltage applied to at least one extraction electrode coupled to the implanter's ion source for extracting ions therefrom. The magnet can be an analyzer magnet employed for selecting one or more ion species of interest, or a steering magnet that can facilitate moving an ion beam over a substrate surface to which the beam is directed.

In a related aspect, the power supplied to the implanter during the power fluctuation event can be allocated to different components of the implanter so as to preserve performance of selected components while the fluctuation persists.

In another aspect, the invention provides a system for managing power supplied to a semiconductor processing apparatus that includes a sensor module for monitoring power supplied to the apparatus and at least one other operational parameter thereof. A power regulating module, which is in communication with the sensor module, can detect power fluctuation events, if any, during a processing session. Upon detection of such an event, the regulating module can interrupt the session. Upon termination of the power fluctuation event, the regulating module can cause resumption of the processing session if the other operational parameter is within an acceptable range.

In related aspect, the invention provides a system for responding to fluctuations in power supplied to an ion implanter during implantation of ions in a substrate that includes a sensor module for monitoring power supplied to the implanter and at least one other operational parameter thereof. The system can further include a power feedback system that communicates with the sensor module for detecting a power fluctuation event that can adversely affect the implanter's operation. The feedback system can deactivate an ion source of the implanter upon detection of a power fluctuation event and can reactivate the ion source upon termination of the fluctuation when the other operational parameter returns to an acceptable value.

In a related aspect, in the system described above, the ion source includes a microwave generator that can be disabled by the feedback system, upon detection of a fluctuation event, so as to deactivate the ion source.

DETAILED DESCRIPTION

Figure 1:
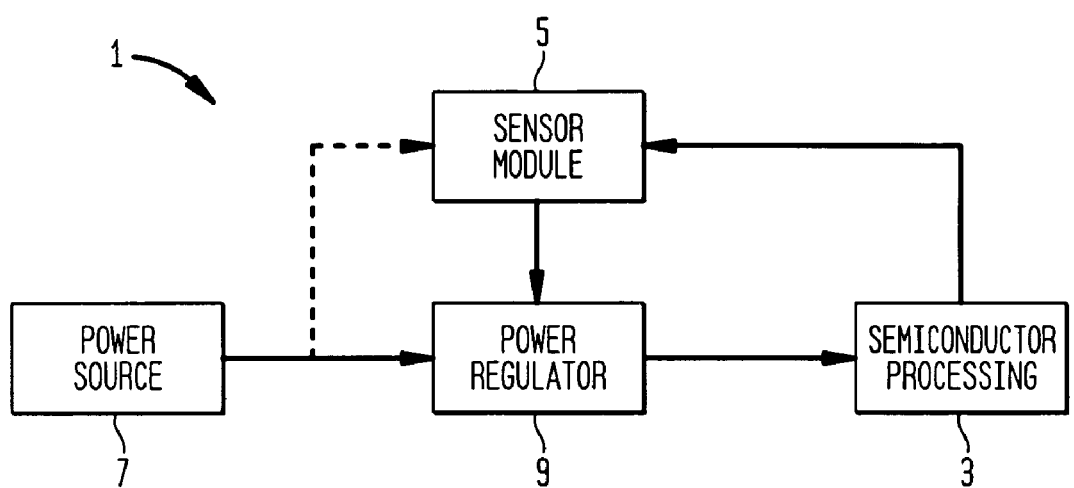
FIG. 1 schematically depicts a system according to one embodiment of the invention for managing power supplied to a semiconductor processing apparatus.

FIG. 1 schematically depicts a system 1 according to one embodiment of the invention for managing power supplied to a semiconductor processing apparatus 3. The power management system includes a sensor module 5 for monitoring power delivered from a power source 7, e.g., line power received from a local power grid, to the apparatus, and a power regulating module 9 that is in communication with the sensor 5 for detecting a power fluctuation event during a semiconductor processing session. Upon detection of a power fluctuation event, the power regulating module interrupts the power processing session. Upon termination of the fluctuation event, the sensor module measures an operational parameter of the apparatus—preferably a parameter that recovers more slowly than others if adversely affected during the fluctuation event. And the power regulating module causes the resumption of the processing session if the measured parameter is within an acceptable range.

Figure 2A:
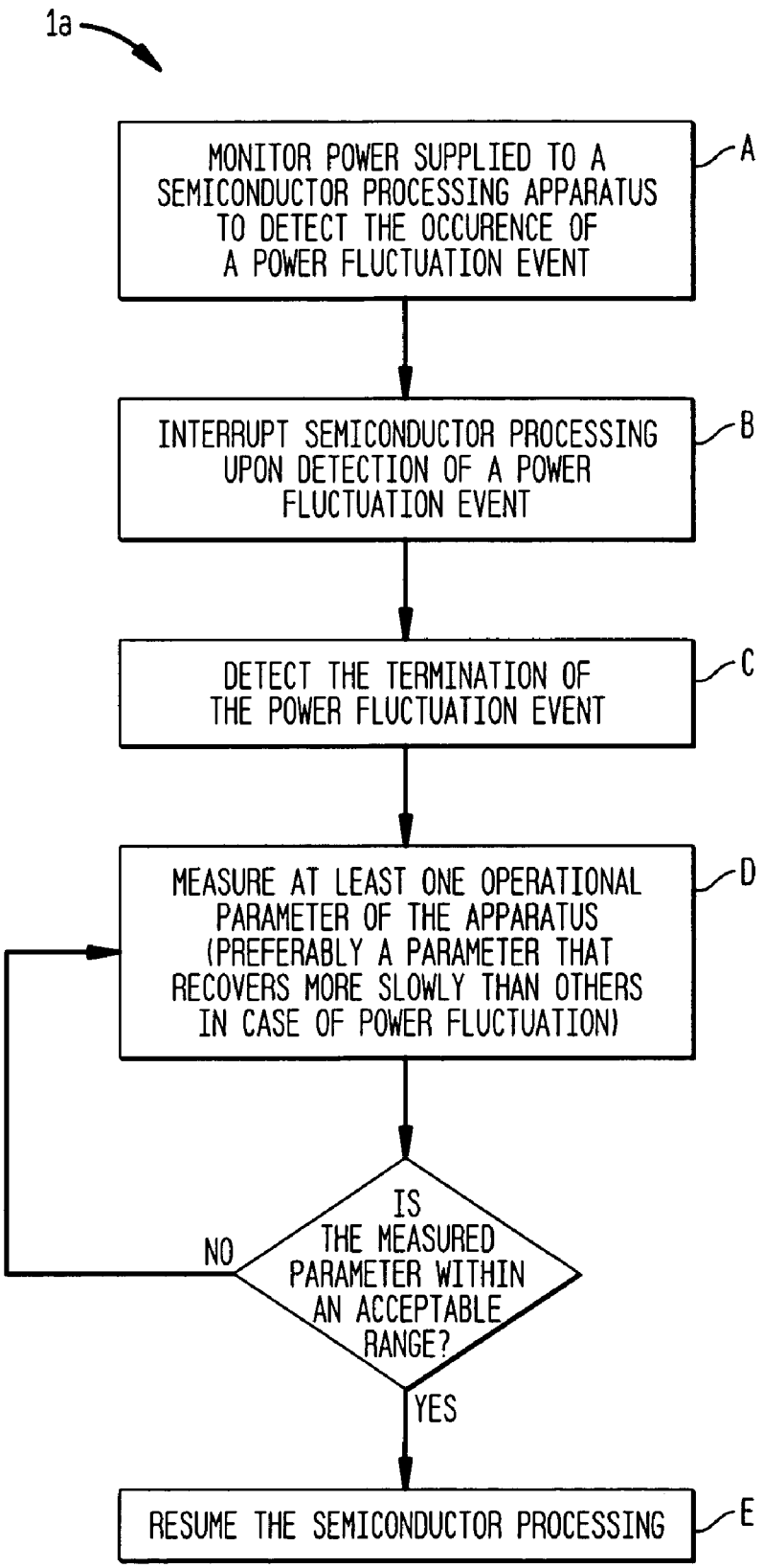
FIG. 2A is a flow chart depicting various steps in a method according to one embodiment of the invention for managing power fluctuations in a semiconductor processing apparatus.

With reference to a flow chart 1a of FIG. 2A, in one aspect, the present invention provides a method for managing fluctuations in power supplied to a semiconductor processing apparatus. In step A, the power supplied to the apparatus is monitored to detect the occurrence of a power fluctuation event during a semiconductor processing session. In step B, upon detection of a power fluctuation event, the semiconductor processing is interrupted. After detecting the termination of the power fluctuation event (step C), at least one operational parameter of the apparatus (preferably a parameter that recovers more slowly than others when adversely affected by a power fluctuation event) is measured (step D). If the measured operational parameter is within an acceptable range, the semiconductor processing session is resumed (step E). Otherwise, the measurement of the operational parameter is repeated until an acceptable level for resuming the semiconductor processing is indicated.

Figure 2B:
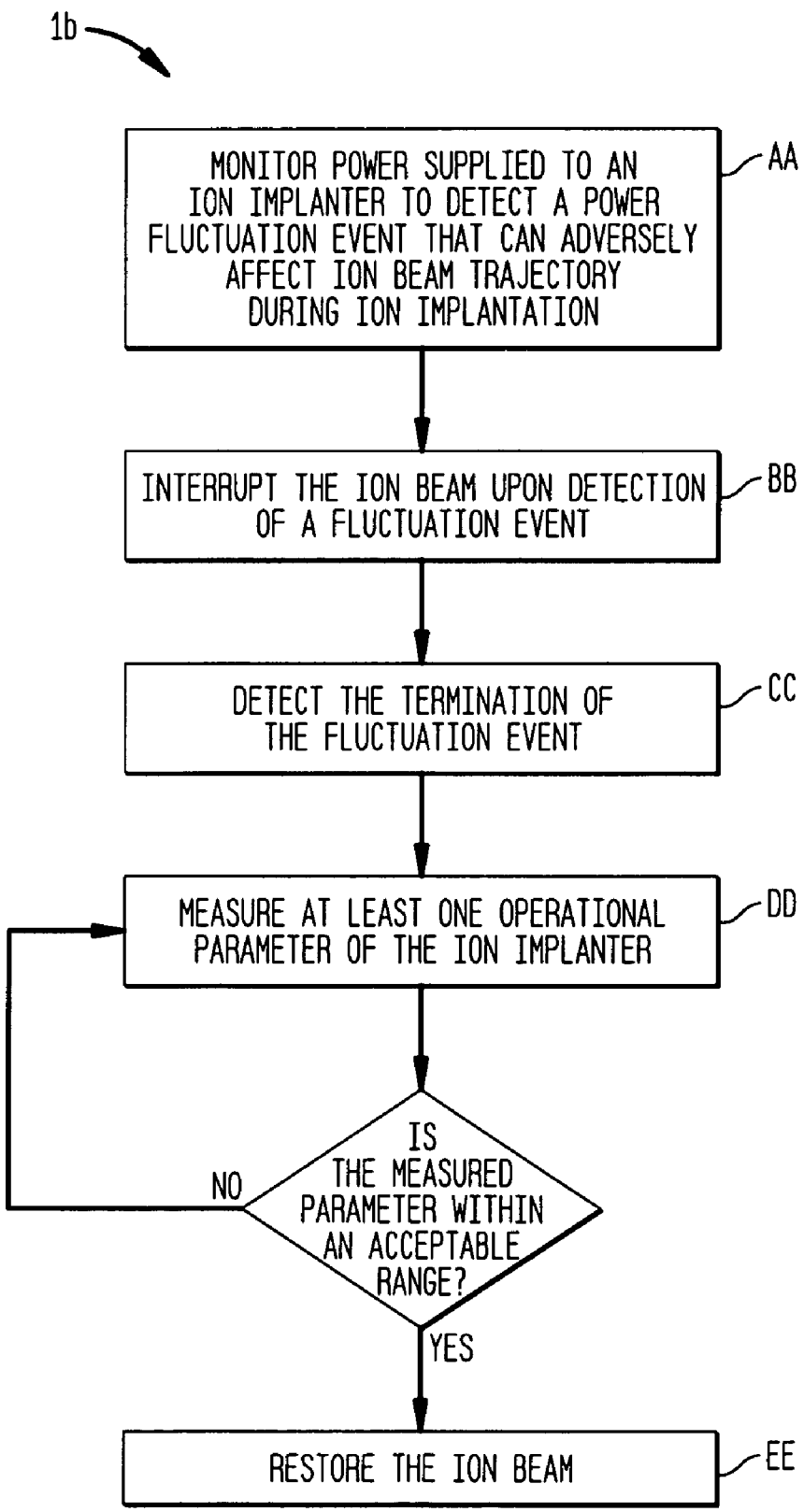
FIG. 2B is another flow chart depicting various steps in a method according to one embodiment of the invention for managing fluctuations in power supplied to an ion implanter, and FIG. 3 schematically depicts an exemplary ion implanter in which a power management system according to one embodiment of the invention is incorporated.

Although the above power management method can be employed in many different semiconductor processing applications, it can be particularly advantageous in ion implantation applications. By way of example, with reference to a flow chart 1b of FIG. 2B, in an exemplary method for managing power supplied to an ion implanter, in a step AA, the power supplied to the ion implanter can be monitored to detect any power fluctuation event that could adversely affect an ion beam (e.g., its trajectory or current density) during ion implantation. Upon detecting such an event, in step BB, the ion beam is interrupted, e.g., by disabling an ion source generating the ion beam. After the end of the power fluctuation event is detected (step CC), at least one operational parameter of the ion implanter is measured (step DD). If the measured value lies within an acceptable range, the ion beam is restored (step EE). Otherwise, the operational parameter is measured again until an acceptable range is indicated before restoring the ion beam. Some exemplary operational parameters that can be monitored include: a level of vacuum within the implanter's housing, the magnetic field strength of an analyzer magnet or a voltage applied to an extraction electrode for extracting ions from an ion source, as discussed in more detail below.

As noted above, power management methods of the invention can be employed in a variety of semiconductor processing applications, and can be implemented in a variety of different ways. In embodiments described below, the implementation of the power management methods is described primarily in connection with an ion implanter. It should, however, be understood that the teachings can be applied to other semiconductor processing apparatus.

Figure 3:
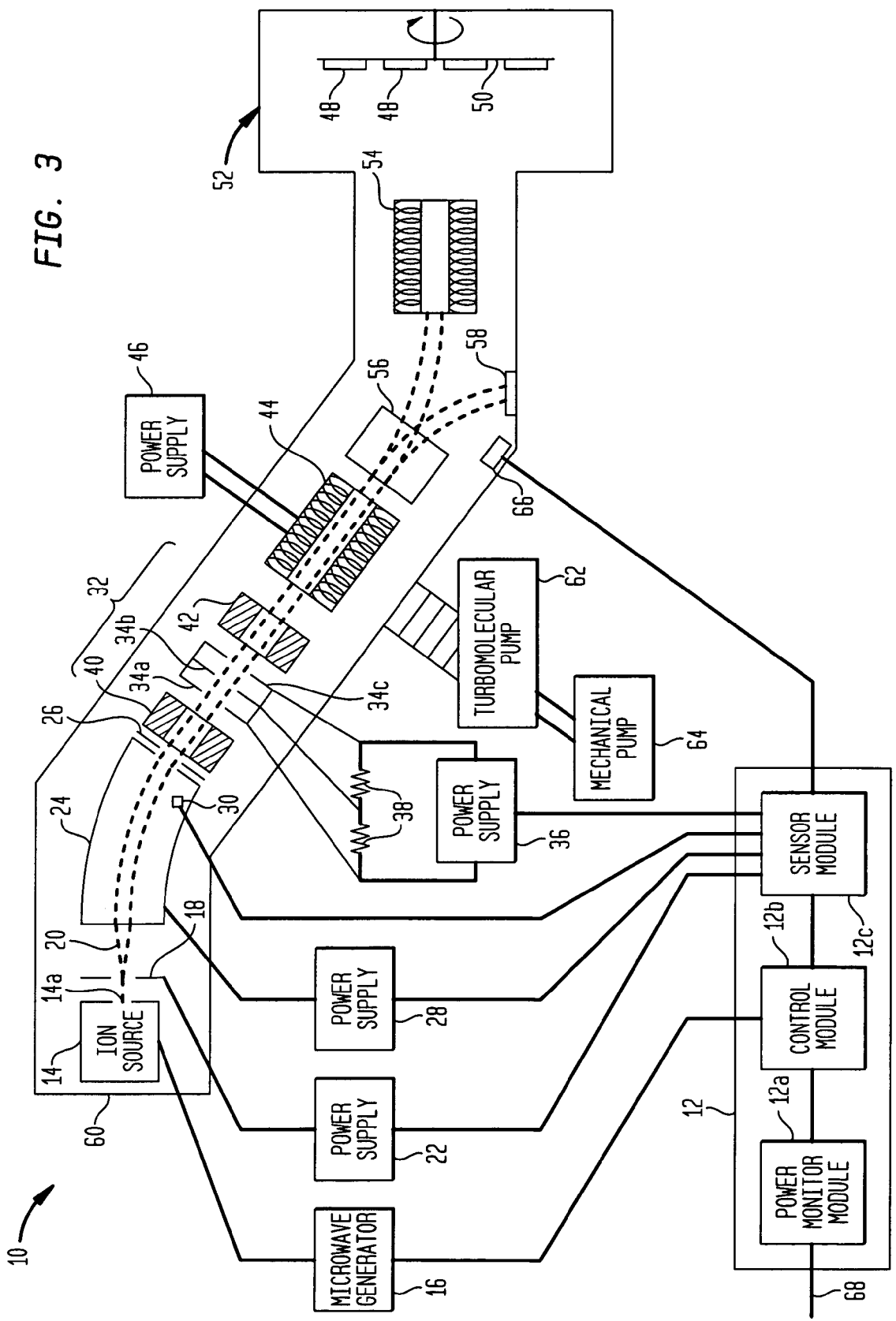

By way of example, FIG. 3 schematically depicts an exemplary ion implanter 10 in which a power management system 12 according to one exemplary embodiment of the invention is incorporated. The ion implanter 10 includes an ion source 14 maintained at a high electrical potential for generating ions of one or more selected species. The ion source receives microwave radiation from a microwave generator 16 for generating an electron cyclotron resonance (ECR) plasma within a gas, e.g., oxygen, contained in the ion source to ionize one or more constituents thereof. In some other ion implanters, an arc ion source can be employed.

One or more extraction electrodes 18 are positioned in proximity of an exit aperture 14a of the ion source to accelerate and extract selected ions present in the ion source plasma so as to generate an ion beam 20. An adjustable voltage power supply 22 applies a selected voltage to the extraction electrode 18 to maintain it at a selected voltage differential relative to the ion source. In this exemplary embodiment, the voltage applied to the extraction electrode can be, for example, in a range of about 5 to about 100 keV. The voltage differential can be positive or negative depending on the sign of the charge of ions to be extracted from the ion source.

An analyzer electro-magnet 24, in the form of a sector electromagnet, receives the ion beam and selects ions belonging to an ion type of interest based on their momentum-to-charge ratios for a given magnetic field strength. More specifically, a bending radius (r) of an ion having a charge (q), a velocity (v), and a mass (M) depends on the magnetic field strength (B) according to the following relations:

$$r = \frac{Mv}{qB}$$

In this exemplary embodiment, a resolving slit 26 coupled to the analyzer magnet further enhances selection of an ion type of interest. A power supply 28 applies a selected voltage or current to the electro-magnet 24 suitable for generating a desired magnetic field strength. In this embodiment, a sensor 30 directly measures the strength of a magnetic field produced by the analyzer magnet (i.e., the magnetic field strength to which ions traveling through the analyzer magnet are exposed). The sensor can be a Hall effect sensor, which is well known in the art and commercially available, for example, from Magnetic Instrumentation, Inc. of Indianapolis, Ind. or other vendors.

With continued reference to FIG. 3, a post-acceleration stage 32 can be employed to obtain a final desired energy of the ions in the beam. More specifically, in this exemplary embodiment, a plurality of acceleration electrodes 34a, 34b, and 34c, herein collectively referred to as acceleration electrodes 34, which are maintained at selected voltage differentials relative to one another by a power supply 36 and resistive elements 38, accelerate the ion beam to a desired energy, for example, an energy in a range of about 10 keV to about 200 keV. The post-acceleration stage 32 further includes two magnetic quadruple elements 40 and 42 that provide additional focusing of the ion beam—before and after passage through the electrodes 34—so as to enhance control of its physical size and its angular spread. A power supply (not shown) can apply a requisite power to the magnetic quadruples 40 and 42 for generating a desired magnetic field to be applied to the ion beam.

A scanner magnet 44, energized by a power supply 46, can apply an oscillating magnetic field for deflecting the ion beam in a scan direction relative to a plurality of wafers 48 mounted on a rotating carousel 50 within an end station 52 of the ion implanter. Each wafer passes through the ion beam on an arc substantially orthogonal to the scan direction of the beam as the carousel rotates. A collimator magnet 54 can be energized by a power supply (not shown) with a suitable electrical waveform to generate an oscillatory magnetic field synchronized with the scanner's primary magnetic field to ensure a substantially uniform irradiance of the wafers by the beam.

The exemplary ion implanter 10 can further include a bending magnet 56 disposed between the scanner 44 and the collimator 54 that can substantially eliminate any residual neutral particles in the beam, and can further enhance the uniformity of the momentum of the beam ions. The particles that are not bent toward the end station by the magnet 56, if any, can be stopped by a beam stop 58.

The ion beam 20 travels through an evacuated enclosure/housing 60 from the ion source through various stages described above to the wafers 48 mounted in the end station 52. More specifically, in this embodiment, two vacuum pumps 62 and 64, maintain the environment within the housing 60 at a low pressure, e.g., a $10^{-6}$ torr. More specifically, the pump 62 can be a turbomolecular pump and the pump 64 can be a mechanical pump that lowers the pressure at the exhaust of the tubromolecular pump below the atmospheric pressure. A vacuum gauge 66 disposed in the housing 60 can provide information regarding the level of vacuum within the housing.

The exemplary ion implanter 10 receives electrical power from a power line 68, e.g., from a local power grid, for energizing its various components, such as, the power supplies 22, 28, 46, and the microwave generator 16. The incoming power on the power line 68, however, can exhibit fluctuations, e.g., a sag in power level, that can adversely affect the operation of the ion implanter. For example, a power sag can lower the strength of a magnetic field generated by the analyzer magnet 24, which can in turn adversely affect the trajectory of the ion beam through the housing. Such an instability in propagation of the ion beam through the housing can potentially result in impingement of ions on the housing's internal surfaces, which can give rise to contamination. In addition, such a power sag can affect the energy of ions to be embedded in the wafers, thereby degrading the quality of ion-implanted wafers.

With continued reference to FIG. 3, the power management system 12 can accommodate fluctuations in the power supplied to the ion implanter 10, via the power line 68, in a manner described in more detail below. In this exemplary embodiment, during operation of the ion implanter, upon detecting a fluctuation event in the incoming power that exceeds a pre-defined threshold, the power management system 12 interrupts the ion beam, e.g., by switching off the microwave generator 16. The power fluctuation event can be defined, for example, to correspond to a sag in the power (e.g., a decrease in instantaneous or root-mean-square (rms) power) that lasts for more than a selected time period (e.g., a power sag that lasts for more than a few milliseconds). The management system 12 further monitors selected operational parameters of the ion implanter, e.g., the strength of a magnetic field generated by the analyzer magnet 24 and the level of vacuum in the housing. After detecting the termination of the power fluctuation event, the power management system 12 restores the ion beam, e.g., by switching on the microwave generator, when at least one of the operational parameters, and preferably all, are within an acceptable range.

More specifically, the exemplary power management system 12 can include a power sensor module 12a that monitors the level of incoming power, e.g., by utilizing a comparator to compare the line voltage with a threshold voltage. When the sensor detects a power line fluctuation, e.g., a power sag, that lasts more than a selected time period, it triggers a control module 12b of the management system to shut off power to the microwave generator 16 in order to interrupt the production of ions in the ion source. In some embodiments, a power sag can be defined, for example, as a drop of about 50% in the line voltage below its normal value that lasts for a time duration in a range of about 50 milliseconds to about 200 milliseconds, or a drop of about 30% in the line voltage below its normal value that lasts for a time duration in a range of about 200 milliseconds to about 500 milliseconds, or a drop of about 20 percent in the line voltage below its normal value that lasts for a time duration in a range of about 500 milliseconds to about 1 second. The following table summarizes exemplary voltage drops and their associated durations that can characterize a voltage sag (a power fluctuation event):

TABLE 1

| Voltage Sag Duration | | | Voltage Drop |
| --- | --- | --- | --- |
| Milliseconds (ms) | Cycles at 60 Hz | Cycles at 50 Hz | Percent of Nominal Voltage |
| 50 to 200 ms | 3 to 12 cycles | 2.5 to 10 cycles | 50% |
| 200 to 500 ms | 12 to 30 cycles | 10 to 25 cycles | 70% |
| 500 to 1000 ms | 30 to 60 cycles | 25 to 50 cycles | 80% |

Those having ordinary skill in the art will appreciate that other combinations of voltage drop and associated duration can also be employed to define a power fluctuation event based on the requirements of a particular semiconductor processing application of interest.

The exemplary power management system 12 can also include a status monitor module 12c that can communicate with the power supply 16 providing power to the ion source microwave generator, the power supply 22 providing power to the extraction electrode 18, the power supply 36 providing power to the acceleration electrodes 32, the power supply 28 providing power to the analyzer magnet as well as the vacuum gauge 66, to receive information regarding selected operational parameters, e.g., the level of vacuum within the housing or the strength of a magnetic field generated by the analyzer magnet. In addition, in some embodiments, the status monitor module can receive information from the Hall effect probe 30 regarding direct measurements of the strength of the magnetic field generated by the analyzer magnet. It should be understood that the status monitor module can receive status information from any desired component, including those not listed above, such as the power supply 46. Conversely, the status monitor can receive information from a subset of the components listed above.

In this exemplary embodiment, the sensor module 12c can communicate with the power supplies as well as various sensors, e.g., the vacuum gauge 66 and the Hall probe 30, via their communications interfaces (not shown) by employing known protocols. For example, many commercial power supplies include such interfaces for receiving commands and providing the status information to an external control and monitoring module.

The information received by the sensor module 12c allows the control module 12b to restore the ion beam, upon termination of the fluctuation event, only if selected operational parameters are within an acceptable range. For example, the level of vacuum within the housing can deteriorate during a power fluctuation event. Hence, monitoring the vacuum level can ensure that the ion beam is restored only upon detecting an acceptable pressure within the housing. In addition, the power supplied to the analyzer magnet can be an indicator of the strength of magnetic field applied by the magnet to the ion beam, which in turn can affect the ion beam's trajectory. Hence, in some embodiments, before restoring the ion beam, the voltage, or current applied to the magnet, is measured to ensure that the magnetic field is within an acceptable range. In those applications in which a direct measurement of the magnetic field may be desirable in order to avoid potential inaccuracies caused by hysteresis effects, the Hall probe 30 can be employed. Another operational parameter of interest can be the voltage applied to the extraction electrode 18, or the voltage differentials between the acceleration electrodes 32. It should be understood that the choice of one or more operational parameters that will be monitored before restoring the ion beam can differ from those described above, and can in general depend on particular design characteristics of an ion implanter, and/or a specific requirements of an ion implantation application.

More specifically, with continued reference to FIG. 3, when the power monitor senses the termination of the power fluctuation event, it triggers the control module to restore the ion beam. In some embodiments, a power fluctuation event is considered terminated when the power level returns to an acceptable level and remains within an acceptable range for a time period that is longer than a selected threshold. This can advantageously inhibit potential instabilities that may arise as a result of rapid power changes. Upon sensing the end of a fluctuation event, the control module polls the sensor module to determine whether selected operational parameters, e.g., the vacuum level, are within an acceptable range for restoring the beam. If so, the control module restores the beam, e.g., by switching on the microwave power generator 16. Otherwise, the control module continues polling the sensor module until suitable conditions for restoring the ion beam are detected. In this exemplary embodiment, at least one of the following operational parameters, and optionally other parameters, are measured before the ion beam is restored: the level of vacuum within the implanter's housing, the strength of a magnetic field generated by the analyzer magnet 24, and the voltage applied to the extraction electrode 18.

The status monitor can continuously monitor selected operational parameters of the ion implanter, or alternatively, it can be triggered by the control module to provide such monitoring when needed. For example, in some embodiments, upon termination of a power fluctuation event, the power monitor module can trigger the sensor module to measure selected operational parameters. Further, it should be understood that although in the above embodiments, separate power supplies are shown for providing power to different components of the implanter, in some other embodiments, a single power supply having a plurality of channels can be employed for this purpose.

Although the above power management system is described in connection with a particular exemplary ion implanter, it should be understood that it also applicable to other semiconductor processing apparatus. For example, it can be employed in ion implanters that employ an arc source, rather than a microwave activated source, to generate ions. In such ion implanters, the arc source can be extinguished upon detection of power fluctuation event, and re-activated when the end of the power fluctuation event is detected if at least one measured operational parameter is within an acceptable range. Similarly, the power management system can be employed, for example, in a plasma etching or a sputtering apparatus.

In another application, a power management system according to the teachings of the invention can be employed in an apparatus for performing plasma enhanced chemical vapor deposition (PECVD). In a typical PECVD reactor, a plasma is generated in proximity of a substrate's surface to cause decomposition of one or more gaseous reactants, and deposition of the decomposition products onto the surface. The power management system can monitor power supplied to the PECVD reactor during a processing session and interrupt the session, e.g., by extinguishing the plasma, upon detection of a power fluctuation event. The process can be resumed upon termination of the power fluctuation event when at least one operational parameter (e.g., the vacuum level in the reactor) is within an acceptable range.

Those having ordinary skill in the art will appreciate that various modifications can be made to the above embodiments without departing from the scope of the invention.

What is claimed is:

1. A method of managing fluctuations in power supplied to a semiconductor processing apparatus, comprising
    monitoring the power supplied to the apparatus,
    detecting a power fluctuation event during a semiconductor processing session,
    interrupting the semiconductor processing upon detection of said power fluctuation event,
    measuring at least one operational parameter of the apparatus after the end of the power fluctuation event, and
    resuming said semiconductor processing when said at least one operational parameter is within an acceptable range.

2. The method of claim 1, wherein said semiconductor processing comprises implanting ions in a semiconductor wafer.

3. The method of claim 1, wherein said semiconductor processing comprises plasma enhanced chemical vapor deposition (PECVD).

4. The method of claim 1, wherein said semiconductor processing comprises a plasma etching process.

5. The method of claim 1, wherein said semiconductor processing comprises a sputtering process.

6. The method of claim 1, wherein said at least one operational parameter comprises a vacuum level in an evacuated chamber in which said semiconductor processing is performed.

7. A method of compensating for fluctuations in power supplied to an ion implanter during implantation of a substrate by an ion beam, the method comprising
    monitoring the power delivered to the implanter during operation,
    detecting a power fluctuation event that can adversely affect the ion beam during ion implantation,
    interrupting the ion beam upon detection of the power fluctuation event;
    detecting an end of the power fluctuation event;
    measuring at least one operational parameter of the implanter after the end of the power fluctuation event, and
    restoring the ion beam after the end of the power fluctuation event when the at least one operational parameter of the implanter is within an acceptable range.

8. The method of claim 7, further comprising continuing monitoring of the power during the power fluctuation event.

9. The method of claim 7, wherein the step of detecting a power fluctuation event further comprises detecting a drop in voltage below a selected threshold.

10. The method of claim 7, wherein the ion beam is generated by a microwave ion source and the step of interrupting the ion beam comprises disabling the microwave generator.

11. The method of claim 7, wherein the step of measuring an operational parameter further comprises measuring an operational parameter to determine whether it is within an acceptable range.

12. The method of claim 7, wherein the step of measuring an operational parameter further comprises measuring a vacuum level of an evacuated chamber of the ion implanter through which a ion beam travels to the substrate.

13. The method of claim 7, wherein the step of measuring an operational parameter further comprises measuring a magnetic field generated by at least one magnet of the ion implanter for magnetic control of the ion beam generated by the ion source.

14. The method of claim 13, wherein the control magnet is an analyzer magnet.

15. The method of claim 7, wherein the step of measuring an operational parameter further comprises measuring a voltage applied to at least one extraction electrode coupled to the ion source for extracting ions therefrom.

16. The method of claim 7, further comprising allocating power to components of the implanter during the fluctuations so as to preserve performance of at least selected components of the implanter while the fluctuations persist.

17. A system for regulating fluctuations in power supplied to an ion implanter during implantation of ions in a substrate, comprising
    a sensor module for monitoring power supplied to the implanter and at least one other operational parameter thereof,
    a power regulating system in communication with the sensor module for detecting a power fluctuation that can adversely affect operation of the implanter, the regulating system deactivating an ion source of the implanter upon detection of a power fluctuation and reactivating the ion source upon termination of the fluctuation when the other operational parameter returns to an acceptable value.

18. The system of claim 17, wherein the ion source comprises a microwave generator.

19. The system of claim 18, wherein the regulating system deactivates the ion source by disabling the microwave generator.

20. The system of claim 17, wherein the ion implanter comprises one or more vacuum pumps for maintaining a chamber through which ions travel to the substrate at a low pressure and wherein the operational parameters monitored by the sensor module comprise the pressure in the evacuated chamber.

21. The system of claim 17, wherein the ion implanter comprises a magnet for magnetic control of an ion beam generated by the ion source, and the operational parameters monitored by the sensor module comprise a magnetic field generated by the magnet.

22. The system of claim 17, wherein the ion implanter comprises one or more extraction electrodes coupled to the ion source for extracting ions therefrom, and the operational parameters monitored by the sensor module comprise a voltage applied to the extraction electrode.

23. The system of claim 17, wherein the sensor module comprises
    a comparator for comparing a power supplied to the implanter with a threshold power value and generating an output signal when the power drops below the threshold value.

24. The system of claim 23, wherein the regulating system comprises a source controller coupled to the ion source and the comparator, and source controller deactivating the ion source upon receiving the output signal of the comparator.

25. A system for managing power supplied to a semiconductor processing apparatus, comprising:
  a sensor module for monitoring power supplied to the apparatus and at least one other operational parameter thereof, and
  a power regulating module in communication with said sensor module for detecting a power fluctuation event during a semiconductor processing session, said power regulating module interrupting said power processing session upon detection of a power fluctuation event and resuming said session upon termination of said power fluctuation event when said at least one operational parameter is within an acceptable range.

* * * * *